United States Patent [19]

Fisher et al.

[11] 4,053,856

[45] Oct. 11, 1977

[54] QUASI-TOROIDAL INDUCTOR AND RESONATOR

[76] Inventors: Sidney T. Fisher, 53 Morrison Ave.; Charles B. Fisher, 2850 Hill Park Road, both of Montreal, Quebec, Canada

[21] Appl. No.: 654,801

[22] Filed: Feb. 3, 1976

[51] Int. Cl.$^2$ .......................... H01P 7/00; H03H 7/04

[52] U.S. Cl. ................................ 333/82 R; 333/82 B; 336/223; 336/225; 336/226

[58] Field of Search ............... 336/222, 223, 225, 226; 333/73 R, 82 R, 82 A, 82 B; 219/10.79

[56] References Cited

U.S. PATENT DOCUMENTS

| | | | |
|---|---|---|---|
| 2,342,896 | 2/1944 | Salzberg | 333/82 A UX |
| 2,414,280 | 1/1947 | Thomas | 333/82 R UX |
| 2,945,189 | 7/1960 | Rowe | 333/82 B X |
| 3,123,787 | 3/1964 | Shifrin | 336/229 |

FOREIGN PATENT DOCUMENTS

| | | | |
|---|---|---|---|
| 656,891 | 9/1951 | United Kingdom | 336/229 |

*Primary Examiner*—Paul L. Gensler
*Attorney, Agent, or Firm*—Barrigar & Oyen

[57] ABSTRACT

An inductor comprises a quasi-toroidal conductive envelope having a discontinuity across which alternating voltage may be applied. The inductor may comprise a plurality of interrupted turns connected in parallel or may be formed by a continuous conductive shell. The cross-section of the envelope may be circular, rectangular, or shaped in any other desired manner. Capacitive elements may be arranged within the interior of the device to form a resonator.

4 Claims, 19 Drawing Figures

QUASI-TOROIDAL INDUCTOR AND RESONATOR

BACKGROUND OF INVENTION

The present invention relates to quasi-toroidal inductor and resonator devices.

Toroidal inductor coils are well known in electrical engineering. Conventionally, a continuous coil of wire is formed into a torus thereby forming a toroidal envelope having a circular section. Since the coil is a continuous conductor, it follows that the turns of which the toroidal coil is formed are series connected. Such a toroidal coil has the desirable property that its electromagnetic field is substantially confined to the interior of the torus. The coil therefore does not require shielding nor does its field couple with that of adjacent inductors.

SUMMARY OF THE INVENTION

In accordance with the present invention, a new form of inductor has been developed of quasi-toroidal configuration. In order to comprehend what is meant by "quasi-toroidal", it is useful first to consider the definitions of "torus" and "toroidal".

A surface of revolution is a surface generated by revolving a plane curve about a fixed line in its plane. The line is called the axis of the surface of revolution.

A conventional torus is a surface of revolution generated by a circle offset from the axis, which circle, when it moves about the axis through 360°, defines the toroidal surface. The section of the torus is the circle which generated it. The inner radius of the torus is the distance between the axis and the nearest point of the circle to the axis, and the outer radius of the torus is the distance between the axis and that point on the circle most remote from the central axis. When a coil of wire is formed having the overall shape of a torus, the coil is said to form a "toroidal conductive envelope", since it envelopes a generally toroidal space.

The present invention is concerned with quasi-toroidal envelopes formed by a plurality of discrete interrupted turns or by a continuous conductive surface. By "interrupted turn" is meant a turn having a discrete discontinuity small with respect to the length of the turn.

A first distinction between a quasi-toroidal envelope and a toroidal envelope is that the section of the quasi-toroidal envelope is not a complete closed curve as is the case in a toroidal envelope, but is an interrupted turn - i.e. a curve which includes a discontinuity (which will later be seen to be necessary in order that an electric current may be passed through the quasi-toroidal envelope from one side of the discontinuity to the other).

A second point of distinction is that a quasi-toroidal envelope need not be a surface of revolution, nor does its section have to approximate a circle. A quasi-toroidal surface includes not only surfaces of revolution formed by rotation of an interrupted circle about an axis but also any practicable topological equivalent thereof, such as a surface of revolution generated by an interrupted rectangle, or such surface "stretched" generally perpendicular to the axis so that an oblong or slab-shaped surface results. In all cases, the discontinuity is small relative to the length of the interrupted turn.

A final point of distinction between a quasi-toroidal surface and a toroidal surface is that generally the latter is thought of as generated by a circle offset by an appreciable distance from the axis, so that the torus resembles the usual conception of the surface of a doughnut. A quasi-toroidal surface however also includes those surfaces of revolution generated by an interrupted turn which touches the axis, and topological equivalents thereof. In other words, the "hole" of the conceptual doughnut can disappear, leaving only a central dimple or conductor (or partially a conductor discontinuity) at the axis.

A quasi-toroidal inductor according to the invention may be formed either of discrete turns or a continuous conductive shell. In the case of an inductor comprised of discrete turns, interrupted turns are connected together on each side of the discontinuity. The turns are at different orientations (i.e. they lie in different planes) so as to form a quasi-toroidal conductive envelope in which each of the turns is connected in parallel with each of the other turns. When a source of alternating voltage is applied across the discontinuity, the device functions as an inductor. Instead of having a plurality of discrete turns, the envelope can be formed as a continuous conductive shell conveniently having an appropriately located discontinuity (e.g. at or near the axis of the quasi-torus) so that an alternating voltage may be applied across the discontinuity. The shell thus behaves as if it were composed of an infinite number of parallel-connected turns.

Depending upon the application, some envelope section other than a circular section may be desired. According to the invention, the quasi-toroidal envelope may be formed having a rectangular section or any other feasible section, provided that the section of the device is always an interrupted turn in which the length of the discontinuity is small compared with the conductive length of the turn, so that the electromagnetic field within the envelope is of a sufficiently high intensity and not subject to unacceptable variations. In general, the form of the quasi-toroidal envelope can be varied to assume any topological equivalent of a quasi-torus having an interrupted circular section, provided always that there is a small discontinuity in the section which occurs at substantially the same relative location relative to the quasi-toroidal envelope as the discontinuity in any other turn or section.

One embodiment of the inductor comprises a continuous conductive shell preferably formed so that the discontinuity in the shell section occurs at or near the axis of the quasi-toroidal shell. In one preferred embodiment, the cross-sectional shape is substantially that of an interrupted circle. The foregoing arrangement lends itself to termination by coaxial cable. To this end, the first terminal is in the form of a cylinder (which may be formed of solid or flexible conductive material) generally concentric with the axis of the shell and of small radius compared with the dimensions of the shell. The cylinder is connected to one side of the discontinuity and extends axially away therefrom. The other side of the discontinuity (located at or in the vicinity of the interior surface of the "dimple" in the shell surface) can be extended internally axially as a conductor lying generally along the axis of the quasi-toroidal shell and continuing into the interior of the cylinder as the central conductor of a coaxial cable, the first-mentioned cylinder forming the sheath for the coaxial cable. The overall shape and configuration of such inductor generally resembles a squat pumpkin having as its "stem" the coaxial cable termination.

The foregoing shell configuration also lends itself to combination with capacitive elements located within the shell so as to form a resonator. The capacitive elements may be arranged to form either a series resonant circuit or a parallel resonant circuit.

In the case of a parallel resonant circuit, one plate of the capacitor is formed at the interior surface of the dimple to which the central conductor of the coaxial cable is connected. The other plate of the capacitor is formed as a conductive surface electrically connected to the cylindrical sheath for the coaxial cable at its terminating end at the corresponding side of the discontinuity in the shell. The latter conductive surface may in one embodiment be an annular surface separated from the first-mentioned plate of the capacitor by a suitable dielectric, and the central conductor of the coaxial cable may then extend through the dielectric and through the central hole of the annular plate of the capacitor (and must of course be insulated from the annular plate). The dimensions and materials will be selected by the designer to devise an inductance-capacitance match for resonance at a particular selected frequency.

In the case of a series resonator, the central conductor of the coaxial cable does not directly make contact with the interior surface of the dimple at one side of the discontinuity but instead is connected to a plate separated from the dimple by a suitable dielectric material. The dimple itself is preferably formed not as a point but as a small mating circular plate so that the dielectric is sandwiched between the dimple plate and the plate connected to the central conductor of the coaxial cable.

Other more complex resonant circuits are possible which may include one or more additional inductive elements mutually inductively coupled to the shell inductor, and may also include additional capacitive elements conveniently connected in series with the central conductor of the coaxial cable, but other arrangements are possible. Where a mutually coupled inductive element is desired, a coil may be arranged to extend within the interior of the quasi-toroidal shell and insulated therefrom (except possibly at its terminals) so that at least one turn of the coil lies generally in the same plane as a section through the shell taken through the axis thereof.

DETAILED DESCRIPTION WITH REFERENCE TO DRAWINGS

Figure 1:
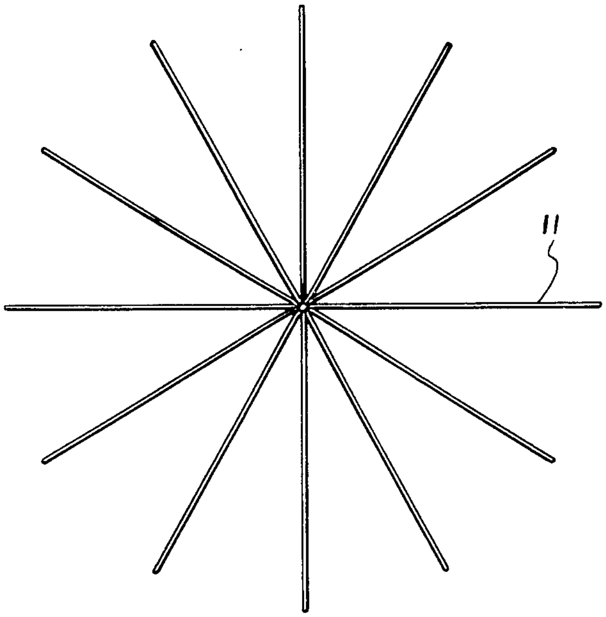
FIG. 1 is a schematic elevation view of a quasi-toroidal inductor formed of discrete turns in accordance with one embodiment of the invention.
Figure 2:
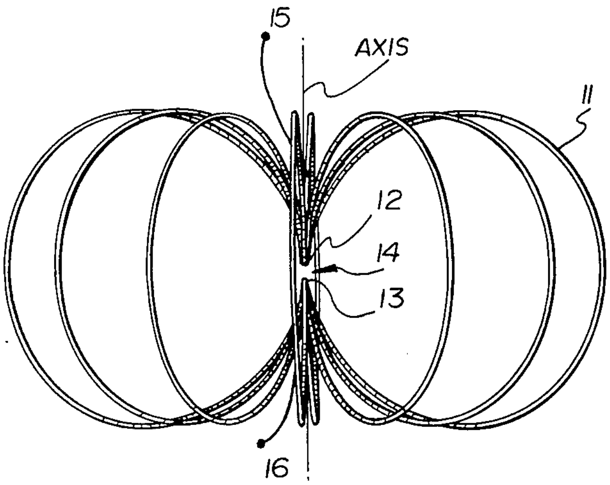
FIG. 2 is a schematic plan view of the inductor of FIG. 1.

In FIGS. 1 and 2, a plurality of interrupted conductive turns 11 are illustrated each having a discontinuity generally indicated as 14. The turns 11 are mechanically and electrically joined together on each side of the discontinuity at junction points 12, 13 respectively. The coils 11 are at different angles from each other; in the embodiment illustrated in FIGS. 1 and 2, twelve representative turns have been illustrated spaced at equal angles of 30° from one another about the axis of the overall quasi-toroidal configuration. Connecting terminal leads 15 and 16 are respectively connected to junction points 12 and 13. When alternating current is applied to the device of FIG. 1 across terminals 15 and 16, the device behaves as an inductor having as its overall inductance the same inductance as a single component turn. However, the characteristics of the electromagnetic field generated within the quasi-toroidal envelope formed by the interrupted turns 11 will depend upon the physical dimensions of the device and upon the voltage, current and frequency of the applied alternating current as well as the number of turns (here 12) constituting the inductor. In general, the same design considerations apply to the electromagnetic field characteristics and electrical parameters of the quasi-toroidal inductor of FIG. 1 as would apply to a toroidal inductor, with the important qualification that in the quasi-toroidal inductor the turns are connected in parallel rather than series, which requires appropriate modifications to be made to calculation of parameter interrelationships.

Figure 3:
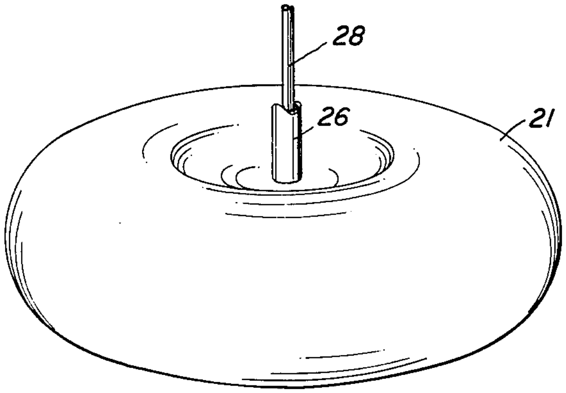
FIG. 3 is a perspective view of an inductor in the form of a quasi-toroidal conductive shell in accordance with another embodiment of the present invention.
Figure 4:
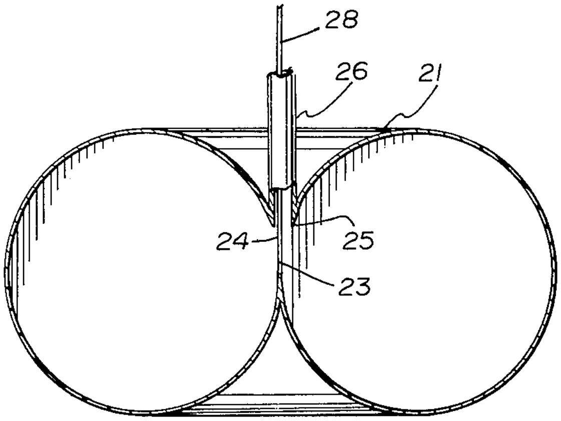
FIG. 4 is a sectional elevation view of the inductor of FIG. 3.
Figure 5:
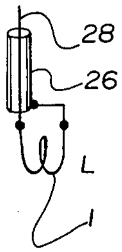
FIG. 5 is an equivalent circuit diagram for the inductor of FIG. 3.

Instead of being formed of discrete parallel-connected turns, the inductor can be formed as a continuous conductive surface or shell, again with the required discontinuity in the cross-section of the structure. Such a continuous shell constructed e.g. of copper with optionally a gold or silver interior surface plating is illustrated in FIGS. 3 and 4, with the equivalent circuit therefor illustrated in FIG. 5. The external envelope of the conductive shell 21 is generally torus-shaped, the inner radius however being effectively almost zero. A gap or discontinuity 24 exists between the lowermost point 23 and the uppermost point 25 of the central shell areas, which appear from outside the structure as "dimples" in the surface. The uppermost dimple area 25 near the axis of the toroidal configuration is projected upwards as a cylindrical coaxial cable sheath 26 in which is centrally located an inner conductor 28 insulated from the sheath 26. The inner conductor 28 is connected to the lower central axial point 23 at the lower dimple of the conducting shell 21. The conductors 26, 28 may be continued indefinitely as a coaxial transmission line. Since the transmission is attached along a zero field line, it should have no appreciable current induced in it by the field of the inductor.

The power factor Q of the inductor of FIGS. 3 and 4 (i.e. the ratio of reactance to resistance) should be very high, since all the current paths are in parallel and cover substantially the entire inner surface of the quasi-toroidal envelope.

A shell such as that of FIG. 3 could be constructed as a pressure vessel for the electric induction heating of the contents thereof. In such case the shell would presumably have to be of multi-component construction at least one of which components would be removable or displaceable so that a charge could be placed within and removed from the interior of the vessel.

Figure 6:
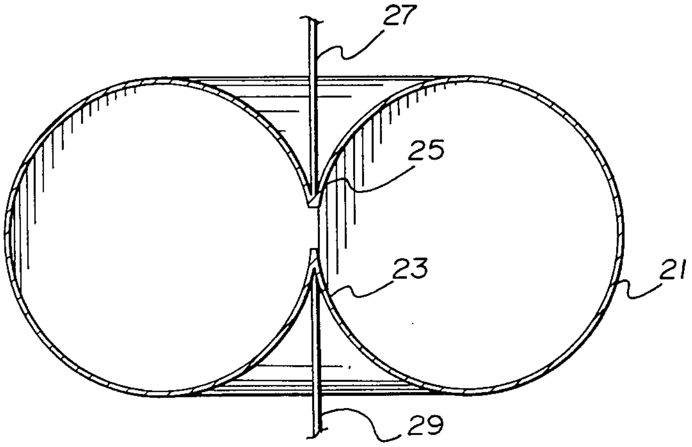
FIG. 6 is a schematic section view of a variant of the inductor of FIG. 3 illustrating an alternative manner of connecting the terminals to the shell.

A coaxial cable lead to the inductor is not necessary; FIG. 6 illustrates an alternative embodiment of the inductor of FIG. 3 in which the electrical leads 27, 29 have been taken from the upper and lower dimples 25, 23 of the quasi-toroidal surface 21. The coaxial transmission line does, however serve as a convenient mounting element for the inductor, and it (and thus the upper dimple 25 of the quasi-toroidal conductive surface 21) can be electrically grounded if desired.

Figure 7:
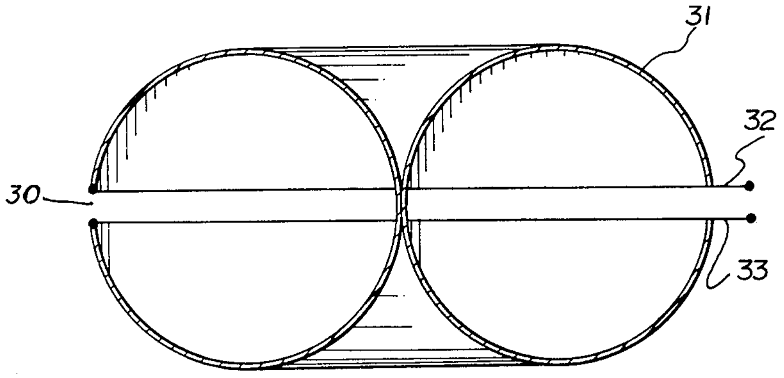
FIG. 7 is a schematic section view of a further variant of a quasi-toroidal conductive shell inductor.

Although a discontinuity at the central axis of the quasi-toroidal configuration is considered to be the most convenient location for such, it should be noted that theoretically the discontinuity could be located along any other equipotential line. For example, the discontinuity could be located at the outer diameter of the quasi-toroidal surface, such as illustrated in FIG. 7. In FIG. 7, a quasi-toroidal shell 31 has a discontinuity 30 extending around its outer periphery. Terminals 32, 33 are then joined to opposite sides of the discontinuity 30.

Figure 8:
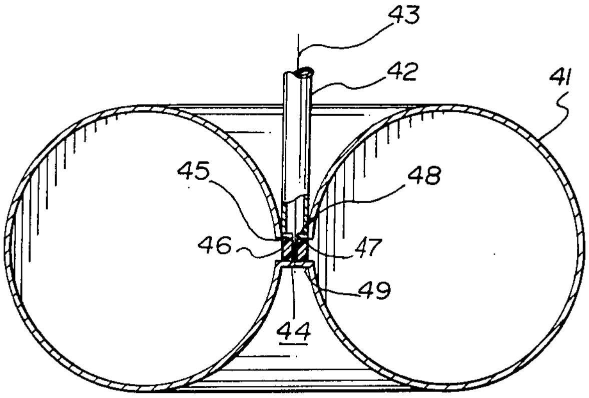
FIG. 8 is a schematic section view through a quasi-toroidal resonator in accordance with a further embodiment of the present invention.
Figure 9:
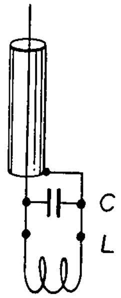
FIG. 9 is an equivalent circuit diagram for the resonator of FIG. 8.

FIG. 8 illustrates a resonator comprising the inductor of FIG. 3 plus a capacitor constructed so as to form with the inductor a parallel resonant circuit. The continuous conductive quasi-toroidal shell 41 is connected at its upper dimple 48 to the outer conductor 42 of a coaxial transmission line. The dimple 48 is also connected both mechanically and electrically to an annular conductor 45 on the upper side of the discontinuity at the axis of the quasi-torus. The centre conductor 43 of the transmission line is connected to a circular conductive surface 44 on the other side of the discontinuity at the lower dimple 49 of the shell. Into the discontinuity is inserted a suitable dielectric material 46 between plates 44 and 45. The plates 44 and 45 and dielectric 46 thus form a capacitor. Conveniently the applicable physical parameters are selected so that this capacitor resonates the inductor at a desired frequency of operation. A hole 47 through the dielectric 46 and upper annular plate 45 of the capacitor permits the inner conductor 43 of the transmission line to pass therethrough and to contact plate 44. The equivalent circuit of this structure is shown in conventional symbols in FIG. 9, and is seen to be a parallel resonant circuit. It will have a high value of Q, and an impedance relatively low for small dimensions and low frequencies, increasing with dimensions and frequency.

Figure 10:
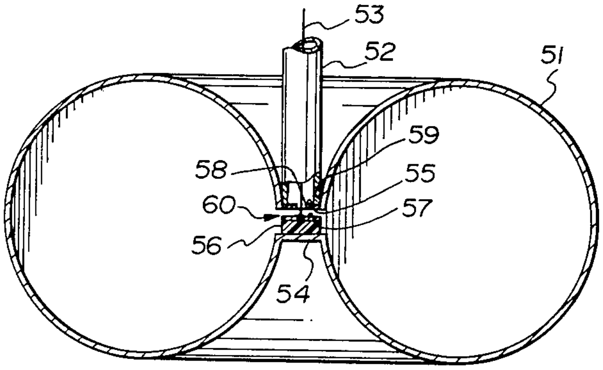
FIG. 10 illustrates a further alternative embodiment in schematic section view of a resonator constructed in accordance with the present invention.
Figure 11:
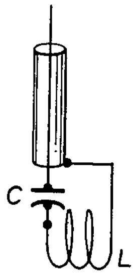
FIG. 11 is an equivalent circuit diagram for the resonator of FIG. 10.

FIG. 10 illustrates a resonator comprising the inductor of FIG. 3 plus a capacitor constructed so as to form a series resonant circuit. The upper dimple 59 of the continuous conductive quasi-toroidal shell 51 is connected to the outer conductor 52 of a coaxial transmission line. A dielectric 56 is placed between lower dimple 54 (in circular plate form) and a circular plate 57 connected to central conductor 53 of the coaxial transmission line. The elements 54, 56, 57 form a capacitor whose capacitance is conveniently designed to resonate the inductor at a desired frequency. A hole 58 through upper annular plate 55 connected to dimple 59 on the upper side of discontinuity 60 permits connection of plate 57 to conductor 53. The equivalent circuit of this structure is shown in conventional symbols in FIG. 11, and is seen to be a series resonant circuit.

Figure 12:
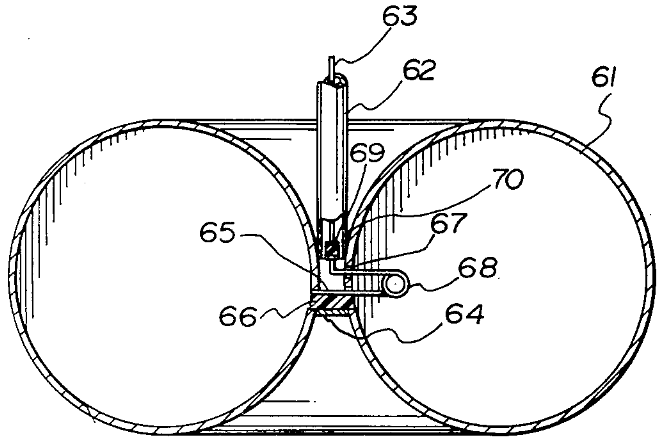
FIG. 12 illustrates in schematic section view a further alternative resonator comprising a quasi-toroidal shell and associated capacitive and mutually inductive elements in accordance with the present invention.

FIG. 12 illustrates a more complex resonator comprising the shunt resonator of FIG. 8 plus a coupling coil 68 and series capacitor 69. The resonator of FIG. 12 affords the advantage that other elements may be coupled to it at any desired impedance. A continuous conductive quasi-toroidal shell 61 is connected to outer conductor 62 of a coaxial transmission line at upper dimple 70. A circular plate 65 is electrically and mechanically connected to the dimple 70. Spaced from plate 65 by dielectric 66 is a circular plate 64 at the lower dimple of the quasi-toroidal shell 61. The elements 64, 65, 66 form a capacitor of the required capacitance value to resonate the one-turn coil formed by the quasi-torus at a desired frequency. The coupling coil 68 is connected between plate 65 and capacitor 69, the coil 68 being oriented so as to present one or more turns in the plane of the current paths in the torus. The coil 68 is connected in series with the capacitor 69 which is in turn connected to the central conductor 63 of the transmission line. A clearance hole 67 in the shell of the quasi-toroidal shell 61 permits connection of the coupling coil 68 to the capacitor 69. (Note that the entire coupling circuit comprising coil 68, capacitor 69, inner transmission line conductor 63, and outer transmission line conductor 62 are connected on the same side of the discontinuity, which is occupied in this case by dielectric 66.)

Figure 13:
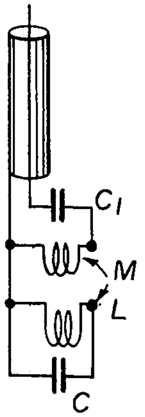
FIG. 13 is an equivalent circuit diagram for the resonator of FIG. 12.

The capacitor 69 has the necessary value of capacitance to resonate the self inductance and mutual inductance of the coupling coil 68 to the resonant frequency of the quasi-torus 61 and the capacitor formed by elements 64, 65, 66. The equivalent circuit of the structure is shown in conventional symbols in FIG. 13, and is seen to consist of a shunt resonant circuit with a series-tuned coupling for connection to an external energy source. The capacitor 69 tuning the coupling coil 68 may of course be omitted or may be in shunt with the coupling coil 68, but will generally be in series, as depicted. The coupling coil may have one or more turns of any diameter that can be contained within the torus, depending on the inductance it is desired to have. It might for example, be formed as a ring having a slightly smaller diameter than that of a section of the quasi-toroidal shell 61, and be spaced from the inner surface of the shell 61 by an insulator.

Topological equivalents of the structures described above may have utility as inductors or resonators. The turns or surfaces may be stretched, compressed, or contorted to meet specific requirements.

Figure 14:
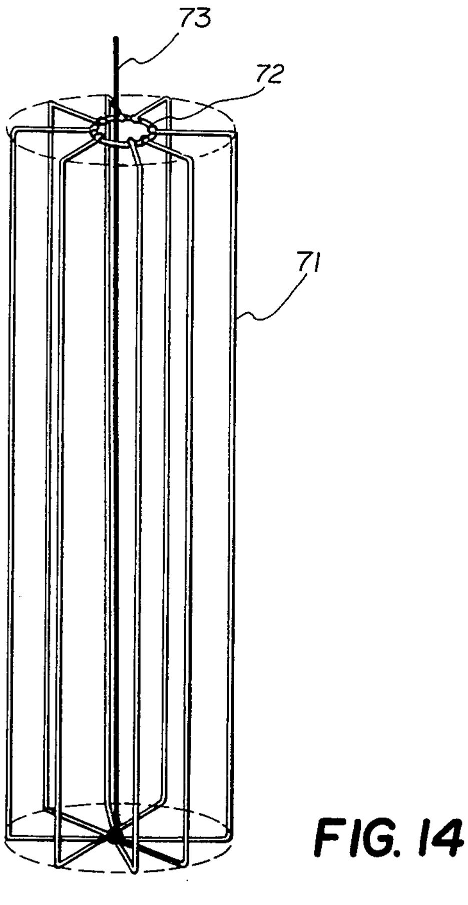
FIG. 14 schematically illustrates a variant of the inductor of FIG. 1 in accordance with a further embodiment of the present invention.

As a first example, FIG. 14 illustrates a variant of the structure of FIG. 1. In this case, the structure comprises elongated interrupted rectangular turns 71 which are arranged about a central axis at different orientations thereby to form a conductive envelope in the overall shape of a right circular cylinder. In the case of FIG. 14, eight such turns are shown by way of example. If FIG. 14 had shown twelve turns instead of eight, the structure of FIG. 14 would have been the exact topological equivalent of FIG. 1. For structural convenience and for efficiency of copper, a common central conductor 73 constitutes the inner conductor at the inner (almost zero) radius of the quasi-toroidal configuration of FIG. 14 for each of the turns 71. For convenience, the other ends of the turns 71 are connected to a connection ring 72, which permits central conductor 73 to pass therethrough, the required discontinuity occurring between conductor 73 and ring 72. The alternating current supplied can then be applied directly between the ring 72 and the conductor 73. The use of a single return conductor 73 constitutes an efficient utilization of copper (or other conductive material used). (This same efficient utilization of conductive material will be found in other configurations to be described below.)

Figure 15:
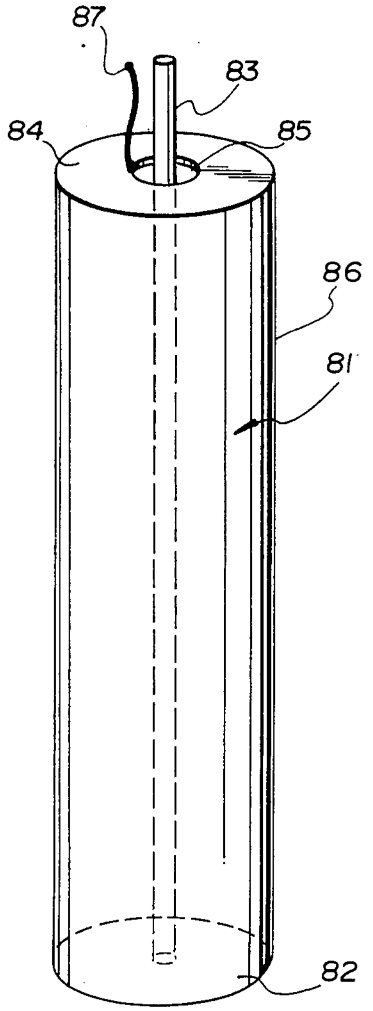
FIG. 15 illustrates a topological equivalent of the shell of FIG. 3 in accordance with yet a further embodiment of the present invention.
Figure 16:
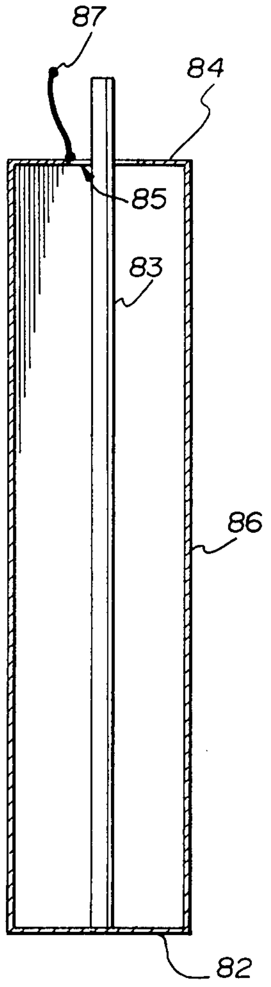
FIG. 16 is a section view through the axis of the quasi-toroidal shell of FIG. 15.

A conductive shell analogue of the structure of FIG. 14 is illustrated in FIGS. 15 and 16. In this case, the conductive shell 81 has the overall shape of a right circular cylinder with a circular conductive bottom surface 82, an annular conductive top surface 84 and a mating curved cylindrical surface 86. A central conductor 83 is connected between the centre of the bottom conductive surface 82 and one terminal of the source of alternating current (not shown). The other terminal of the source of alternating current may be connected to terminal 87 which is connected to the innermost portion of the annular top conductive surface 84. The required discontinuity 85 exists between the conductor 83 and annular plate 84.

Figure 17:
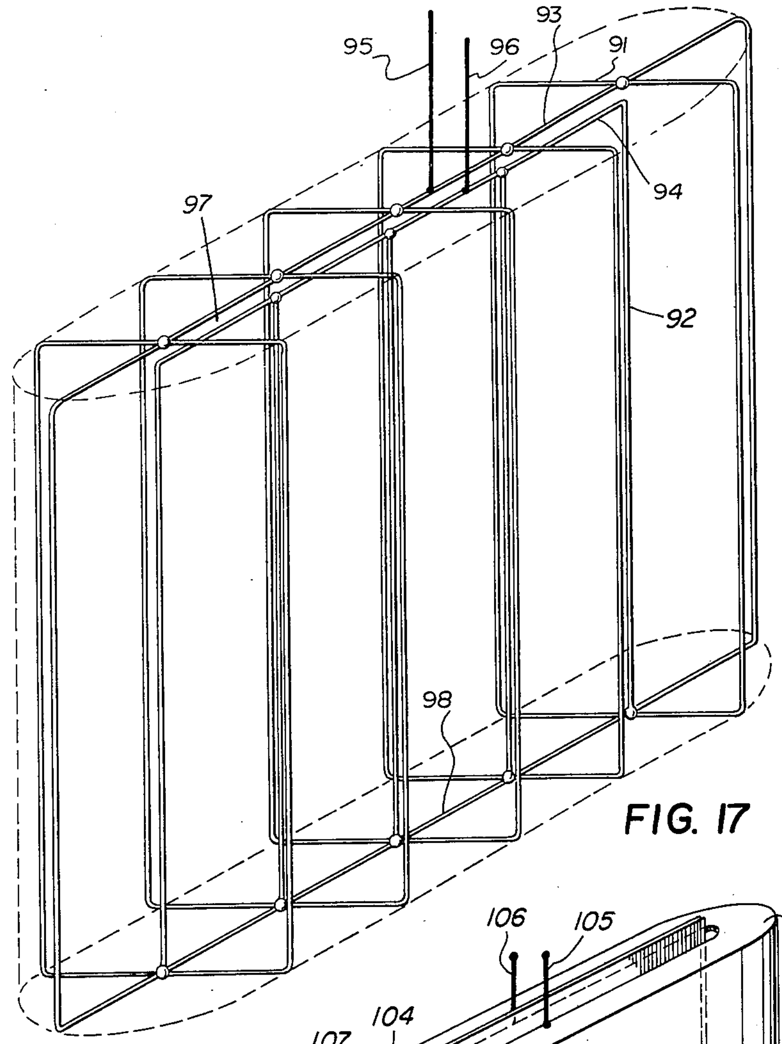
FIG. 17 schematically illustrates a topological equivalent of the inductor of FIG. 1 in accordance with a further embodiment of the present invention.

The right circular cylindrical configuration can be stretched or elongated to form a further conductor configuration according to the invention. FIG. 17 is the exact topological equivalent of FIG. 1, and can be conceived of as a laterally stretched version of the structure of FIG. 14. It, like the structure of FIG. 14, comprises a plurality of interrupted rectangular turns, twelve such turns being illustrated. The overall shape is that of a slab with curved ends. The innermost component conductors 92 of the interrupted rectangular turns 91 are interconnected by a conductor 94 lying near the top of the envelope to an input terminal 96. The other ends of the turns 91 are also connected to a common conductor 93 which is in turn connected to a terminal 95. The alternating current for the inductor may be applied across terminals 95 and 96. Note that a common base conductor 98 connects all the turns together at the innermost ends of their bottom extremities. The required discontinuity 97 occurs between conductors 93 and 94.

Figure 19:
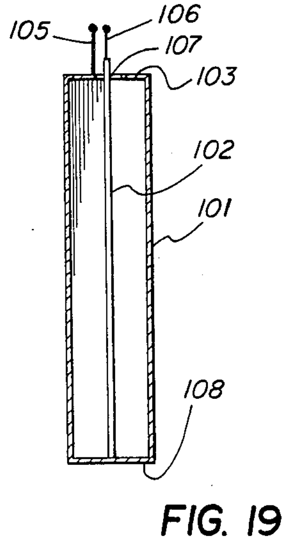
FIG. 19 is a cross-section view of the inductor of FIG. 18.
Figure 18:
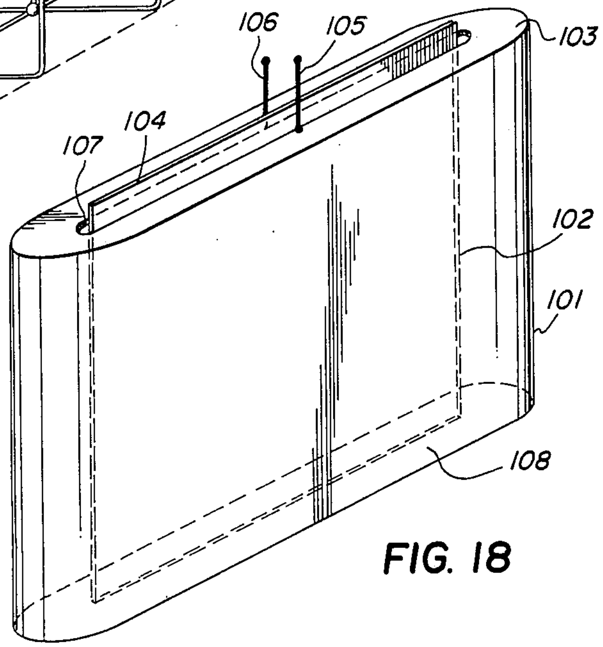
FIG. 18 is a schematic perspective view of yet a further alternative embodiment of the present invention constituting a topological equivalent of the quasi-toroidal surface of FIG. 3.

The conductive shell equivalent of the structure of FIG. 17 is illustrated in FIGS. 18 and 19. Again an overall slab shape with curved ends is achieved. In this case an oblong conductive base 108, a continuous curved elongated cylindrical side wall 101 and an elongated annular top surface 103 comprise the conductive shell. A conductive plate 103 is connected centrally longitudinally along the conductive base 108 and projects upwards through slot 107 (forming the required discontinuity) in upper surface 103. One terminal 106 for the device may be connected to the uppermost portion 104 of central plate 102 and the other terminal 105 of the device may be connected to the inner rim of the top conductive surface 103.

While in the case of FIGS. 1-16 it has been possible to refer to the "axis" of the quasi-torus without ambiguity, the topological equivalents of FIGS. 17 and 18 present problems in this regard since in effect the "axis" has been "stretched" into a plane (roughly coextensive with plate 102 in FIG. 18) or as defined by the set of central conductors 92 in FIG. 17. Reference in the appended claims to the "axis" must therefore be understood as including reference to a stretched or contorted axis where the conductive element departs from circular symmetry by stretching or contortion.

A number of specific embodiments of the invention have been described. The full scope of the invention, however, is as defined in the appended claims.

What is claimed is:

1. A resonator comprising a quasi-toroidal inductive envelope formed by a continuous conductive shell having a discontinuity in the surface near the axis thereof, the discontinuity being small in comparison with the perimeter of the shell taken along a cross-section through the axis of the quasi-toroidal envelope, a first terminal in the form of a cylinder of small radius compared with the dimensions of the shell concentric with the axis of the shell and extending axially away from and connected to one side of the discontinuity, a second terminal in the form of a conductor lying generally along the axis of the shell electrically connected to and extending axially from the other side of said discontinuity to the interior of said cylinder and insulated therefrom, thereby to form a co-axial cable termination for said resonator, and a capacitor formed between the first and second terminals in the vicinity of the discontinuity of said surface, thereby to form a parallel resonant circuit.

2. A resonator as defined in claim 1 additionally comprising a mutually coupled inductive element located within and insulated from the shell and series connected between the second terminal and the capacitor.

3. A resonator comprising a quasi-toroidal conductive envelope formed by a continuous conductive shell having a discontinuity in the surface near the axis thereof, the discontinuity being small in comparison with the perimeter of the shell taken along a cross-section through the axis of the quasi-toroidal envelope, a first terminal in the form of a cylinder of small radius compared with the dimensions of the shell concentric with the axis of the shell and extending axially away from and connected to one side of the discontinuity, a second terminal in the form of a conductor lying generally along the axis of the shell and extending axially from the other side of said discontinuity to the interior of said cylinder and insulated therefrom, thereby forming a co-axial cable termination for said inductor, and a capacitor formed between said second terminal and said other side of said discontinuity, said second terminal being electrically connected to said other side of said discontinuity through said capacitor, thereby to form a series resonant circuit.

4. A resonator as defined in claim 3, additionally comprising a second capacitor series connected between the mutually coupled inductive element and the second terminal.

* * * * *